United States Patent
Nakamura et al.

(10) Patent No.: US 8,421,710 B2
(45) Date of Patent: Apr. 16, 2013

(54) LIGHT SOURCE APPARATUS AND HEAD-UP DISPLAY APPARATUS INCORPORATING THE LIGHT SOURCE APPARATUS

(75) Inventors: Yukio Nakamura, Tokyo (JP); Hiroshi Toyama, Tokyo (JP)

(73) Assignee: Oki Data Corporation, Tokyo (JP)

( * ) Notice: Subject to any disclaimer, the term of this patent is extended or adjusted under 35 U.S.C. 154(b) by 604 days.

(21) Appl. No.: 12/656,301

(22) Filed: Jan. 25, 2010

(65) Prior Publication Data

US 2010/0188720 A1 Jul. 29, 2010

(30) Foreign Application Priority Data

Jan. 27, 2009 (JP) .................. 2009-014892

(51) Int. Cl.
*G09G 5/00* (2006.01)
*G06F 3/038* (2006.01)

(52) U.S. Cl.
USPC .............................................. 345/7; 345/205

(58) Field of Classification Search .............. 359/13, 359/630–633; 345/7–9, 33, 39, 44, 46, 82, 345/204, 205
See application file for complete search history.

(56) References Cited

U.S. PATENT DOCUMENTS

| | | | | |
|---|---|---|---|---|
| 5,734,357 A | * | 3/1998 | Matsumoto | 345/7 |
| 2009/0159345 A1 | * | 6/2009 | Kobayashi et al. | 178/18.09 |
| 2009/0161039 A1 | * | 6/2009 | Toyama et al. | 349/68 |

FOREIGN PATENT DOCUMENTS

| | | |
|---|---|---|
| JP | 11-067448 | 3/1999 |
| JP | 2008-28322 | 2/2008 |
| JP | 2008-159767 | 7/2008 |

* cited by examiner

*Primary Examiner* — Alessandro Amari
(74) *Attorney, Agent, or Firm* — Rabin & Berdo, P.C.

(57) ABSTRACT

A light source apparatus emits light image information. A reflective layer is formed on a planarization film formed on a metal substrate. LED thin films are arranged in a matrix having columns extending in first directions and rows extending in second directions perpendicular to the first directions, the LED thin films being bonded to the reflective layer by means of intermolecular force. First wires are connected to first electrodes of the LED thin films. Second wires are connected to second electrodes of the LED thin films. A first driver circuit selectively electrically drives the LED thin films, arranged in the rows, via the plurality of first wires. A second driver circuit selectively electrically drives the LED thin films, arranged in the rows, via the plurality of second wires.

7 Claims, 8 Drawing Sheets

LIGHT SOURCE APPARATUS AND HEAD-UP DISPLAY APPARATUS INCORPORATING THE LIGHT SOURCE APPARATUS

BACKGROUND OF THE INVENTION

1. Field of the Invention

The present invention relates to a light source apparatus and a head-up display apparatus incorporating the light source apparatus.

2. Description of the Related Art

Conventional automobiles and aircraft incorporate a head-up display (HUD) that displays display information received from various measuring instruments such as a speedometer or a fuel meter, map information for a navigation apparatus, and image information captured by an image-capturing apparatus.

For example, an on-vehicle head-up display apparatus includes a light source, a liquid crystal display (LCD) panel, a dichroic mirror, and a hologram mirror, which are installed behind an instrument panel of a vehicle. The various items of information displayed on a liquid crystal display panel are reflected by the dichroic mirror and hologram mirror, thereby projecting the optical information on a part of the window of the vehicle or on a reflective layer disposed at a position forward of the driver. In this manner, various items of information may be displayed as a virtual image, allowing the driver to visually recognize the formation without redirecting his or her line of sight.

Also, a head-up display has been proposed which employs an organic electroluminescence (EL) panel or a light emitting panel in which organic electroluminescence elements are arranged in a matrix of columns and rows (see Japanese Patent Application Laid-Open No. H11-67448). The organic EL elements of the organic EL panel are driven to emit light in accordance with video data information. Thus, the head-up display employing the organic EL elements has high intensity, not requiring a separate light source. In addition, the head-up display may be of simple, lightweight construction, thus lending itself to miniaturization. The organic EL panel includes a thin film constituted of a dielectric mirror, a clear electrode, a hole transport layer, a light emitting layer, and metal electrodes, aligned in this order on a glass substrate. Another glass substrate is placed on the thin film so that the thin film is sandwiched between the two glass substrates and is sealed from the environment by using a UV curable resin.

Since organic EL elements emit light by itself, a conventional head-up display apparatus does not require a separate light source. In order to display information on a reflective layer, the organic EL panel is required to display the information at high intensity. Unfortunately, the organic EL elements usually lose their intensity in a short time if high voltage is applied to them or large current flows through them.

In addition, an organic EL panel has a thin film sandwiched between two glass substrates and is sealed with resin. Thus, the panel is mounted to a head-up display apparatus with the glass surface directly bonded to the chassis of the head-up display for securely mounting the panel, or bonded to a bracket which in turn is fixed to the chassis of the apparatus. However, the bonded surface areas of the glass substrate are sensitive to impact or shock, and therefore the organic EL panel is often damaged before it is fixed to the chassis.

SUMMARY OF THE INVENTION

An object of the invention is to solve the drawbacks of the aforementioned conventional apparatus.

Another object of the invention is to provide a light source apparatus that lends itself to miniaturization, and a head-up display that employs the light source apparatus.

Still another object of the invention is to provide a head-up display in which a thin film of light emitting diodes is formed of an inorganic material and is integrally arranged in matrix form on a metal substrate.

Yet another object of the invention is to provide a head-up display which is not susceptible to damage during assembly, is of simple construction, and has a long life and high intensity.

A light source apparatus emits light image information. A reflective layer is formed on a planarization film formed on a metal substrate. LED thin films are arranged in a matrix having columns extending in first directions and rows extending in second directions perpendicular to the first directions, the LED thin films being bonded to the reflective layer by means of intermolecular force. First wires are connected to the first electrodes of the LED thin films. Second wires are connected to the second electrodes of the LED thin films. A first driver circuit selectively electrically drives the LED thin films, arranged in the rows, via the plurality of first wires. A second driver circuit selectively electrically drives the LED thin films, arranged in the rows, via the plurality of second wires.

A head-up display apparatus includes the aforementioned light source apparatus. The head-up display apparatus includes a dichroic mirror, a hologram mirror, and a reflective layer. The dichroic mirror reflects light emitted from the light source apparatus. The hologram mirror reflects the light reflected from the dichroic mirror to the reflective layer. The reflective layer includes holographic optical elements whose reflection angles vary depending on the wavelength of light. The reflecting layer reflects the light toward a viewer.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

The present invention will be described in detail with reference to the accompanying drawings.

First Embodiment

Figure 1:
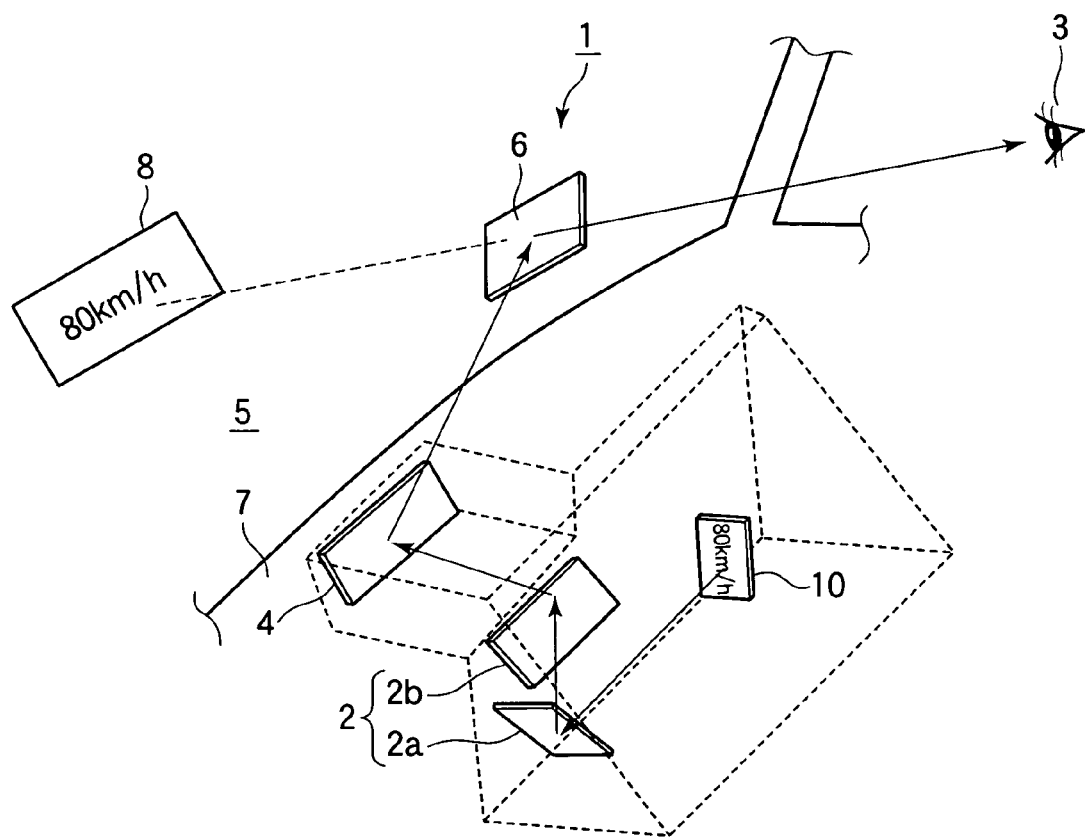
FIG. 1 illustrates the configuration of a head-up display apparatus of a first embodiment.

FIG. 1 illustrates the configuration of a head-up display apparatus 1 of a first embodiment.

Referring to FIG. 1, the head-up display apparatus 1 includes a light source apparatus 10, a dichroic mirror 2, a hologram mirror 4, and a reflective layer 6.

The head-up display apparatus 1 is commonly employed in automobiles and aircraft for displaying physical quantity information obtained from various measuring instruments such as a speedometer and a fuel meter, map information for a navigation apparatus, and image information captured by an image-capturing apparatus. The head-up display apparatus 1 may also be used for any display purposes. For convenience of explanation, the head-up display apparatus 1 will be described in terms of a display apparatus that displays physical quantity information obtained from various measuring instruments such as a speedometer and a fuel meter, map information and guide information for a navigation apparatus, information on a car's perimeter captured by an image-capturing apparatus, and image information displayed by a variety of video equipment such as a TV receiver, a DVD player, a video tape player.

The light source apparatus 10, dichroic mirror 2, and hologram mirror 4 are disposed inside of an instrument panel 7 (i.e., dashboard of a vehicle). The reflective layer 6 is disposed on an inner surface of a clear windshield 5 located above the instrument panel 7. Referring to FIG. 1, the dichroic mirror 2 includes optical mirrors 2a and 2b. Alternatively, the dichroic mirror 2 may be a single optical mirror, a combination of three or more optical mirrors, or an optical prism.

When the head-up display apparatus 1 is driven by a control apparatus (not shown), the light source apparatus 10 emanates an optical image (e.g., "80 km/h"). The optical image or light is reflected by the dichroic mirror 2, and then enters the hologram mirror 4. The hologram mirror 4 is a so-called holographic lens and reflects the light emitted from the light source apparatus 10. Then, the light exits the hologram mirror 4 and illuminates the reflective layer 6.

The reflective layer 6 is a so-called combiner, and includes holographic optical elements whose reflection angles vary depending on the wavelength of light. The reflective layer 6 reflects the light reflected from the hologram mirror 4 toward the driver's eyes 3.

The light source apparatus 10 emits the image light which in turn forms a virtual image 8 at a location forward of the windshield 5 in the line of sight of the vehicle driver. Thus, the driver can recognize a variety of items of information, for example, "80 km/h" shown in FIG. 1.

The configuration of the light source apparatus 10 will be described in detail.

Figure 2:
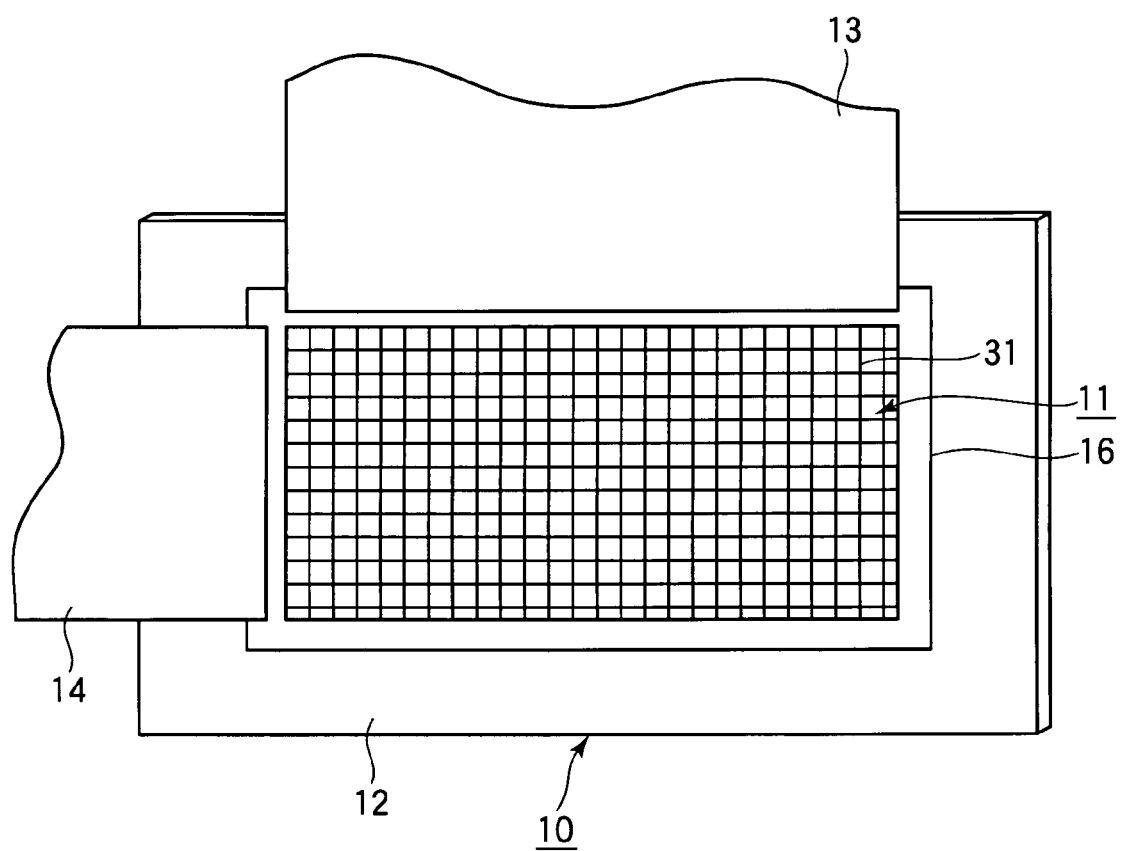
FIG. 2 illustrates the general configuration of a light source apparatus of the first embodiment.
Figure 3:
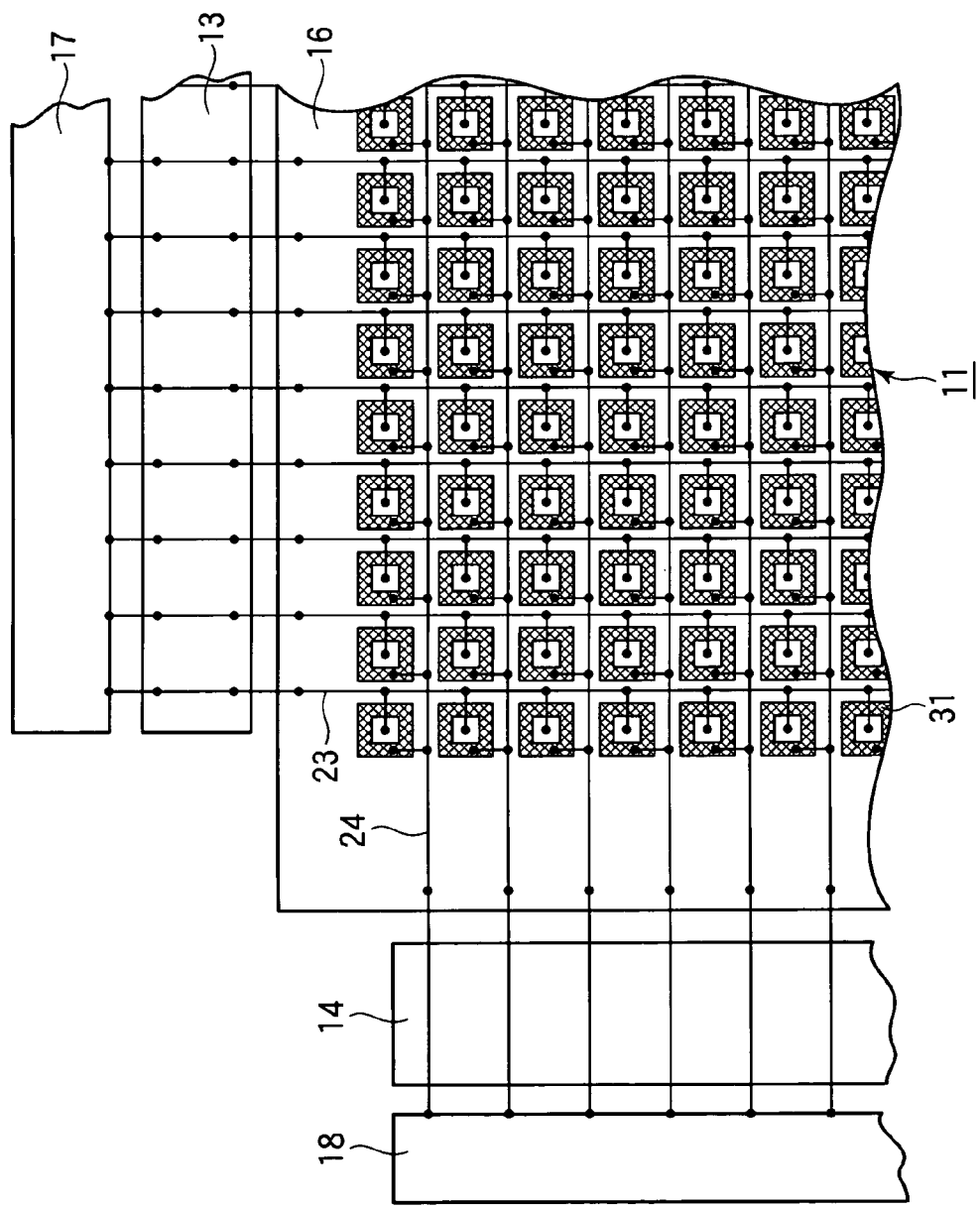
FIG. 3 is an illustrative diagram of the circuit configuration of the light source apparatus.

FIG. 2 illustrates the general configuration of the light source apparatus 10 of the first embodiment. FIG. 3 is an illustrative diagram of the circuit configuration of the light source apparatus 10.

Referring to FIG. 2, the light source apparatus 10 includes a metal substrate or a substrate 12 of a plate-like member of, for example, copper or aluminum, and LED array 11 formed on the substrate 12. The substrate 12 is in the shape of a rectangular plate having mounting holes (not shown) formed at its four corner portions, so that the substrate 12 may be secured to a chassis (not shown) or an instrument panel 7 of the head-up display apparatus 1 by means of bolts or small screws.

The substrate 12 has a mirror-like surface formed by electrolytic polishing. A planarization film 16 is formed on the mirror-like surface. The LED array 11 is formed on the planarization film 16. The planarization film 16 is an organic insulating film such as polyimide resin or an inorganic insulating film of, for example, silicon-nitride or silicon oxide, having a thickness in the range of 200-600 angstroms. The planarization film 16 has a surface roughness in the range of 20-60 nm.

The LED array 11 has a plurality of light emitting diodes (LEDs) 31 in the form of an LED thin film, the LEDs 31 being arranged in a matrix of columns and rows. The LEDs 31 each have a first electrode or an anode electrode connected to a first wire or anode wire 23, and a second electrode or a cathode electrode connected to a second wire or a cathode wire 24. Each of the LEDs 31 is connected to an anode circuit 17 via the anode wire 23 and to a cathode circuit 18 via the cathode wire 24.

The anode circuit 17 includes, for example, a shift register circuit, a latch circuit, a constant current source circuit, an amplifier, which are all integrated in the anode circuit 17. In accordance with drive data, the anode circuit 17 supplies current to the LEDs 31 in a row selected by the cathode circuit 18.

The cathode circuit 18 includes, for example, selector circuits, and selects appropriate LEDs 31 via the cathode wires 24 connected to the LEDs 31 in accordance with the frame signal.

As shown in FIG. 3, the LED array 11, anode circuit 17, and cathode circuit 18 are spaced apart. The cathode wires 24 and anode wires 23 formed on the planarization film 16 are connected to the cathode circuit 18 and anode circuit 17, respectively, via a cathode substrate 14 and an anode substrate 13 in the form of a flexible circuit board having conductive traces formed on a thin film-like substrate of, for example, polyimide. The anode circuit 17 may be formed on the anode substrate 13. The conductors on the anode substrate 13 and cathode substrate 14 are electrically connected to the anode wires 23 and cathode wires 24 via an anisotropic conductive film.

The configuration of the LED array 11 will be described in detail.

Figure 4:
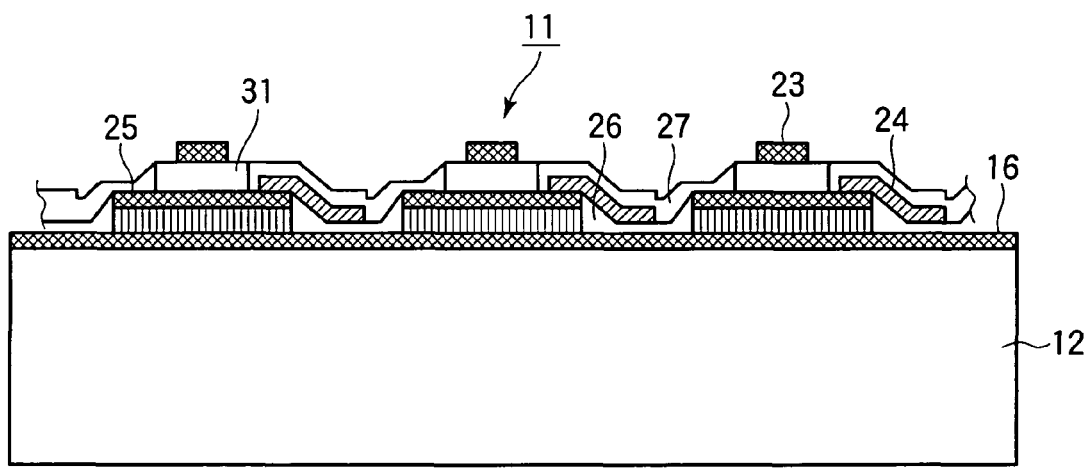
FIG. 4 is a cross-sectional view of an LED array 11 taken along a line A-A of FIG. 5.
Figure 5:
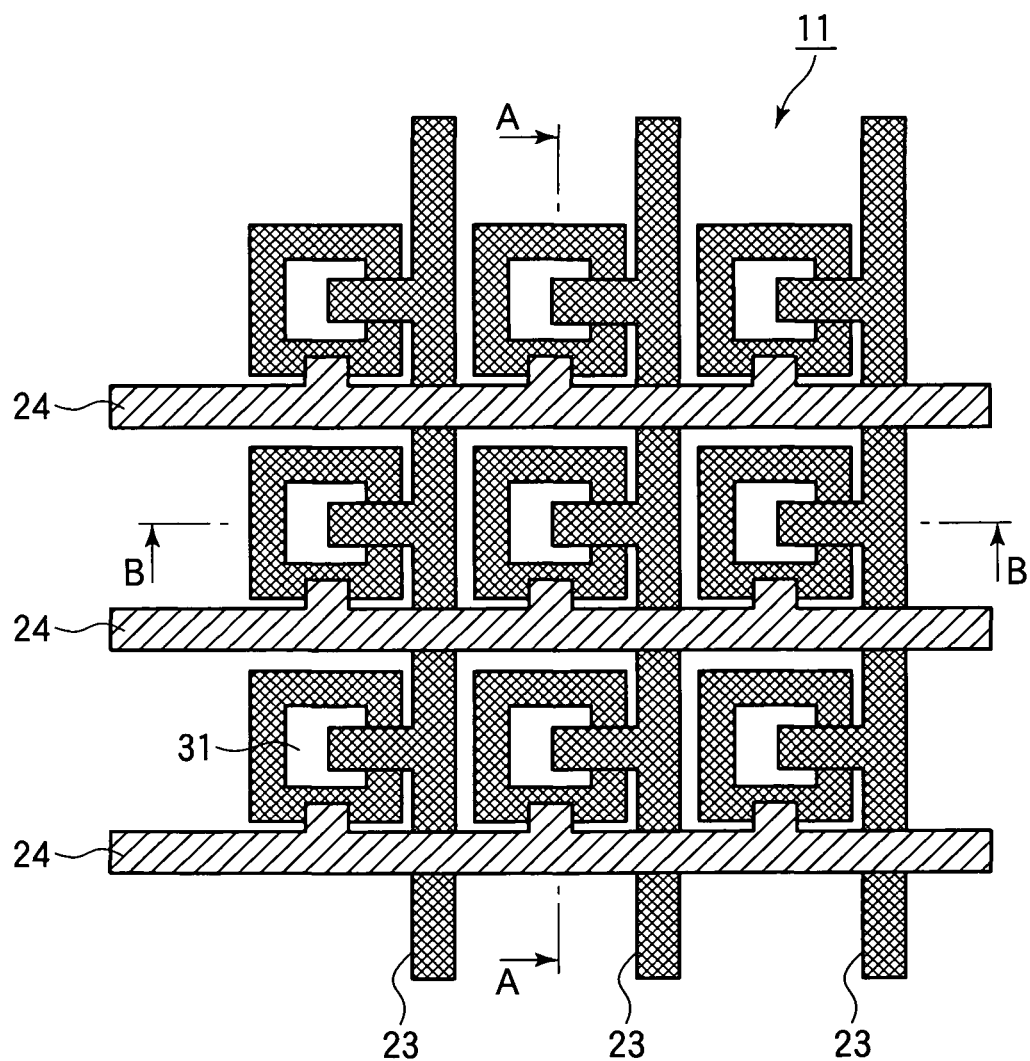
FIG. 5 is a partial expanded view of the LED array.
Figure 6:
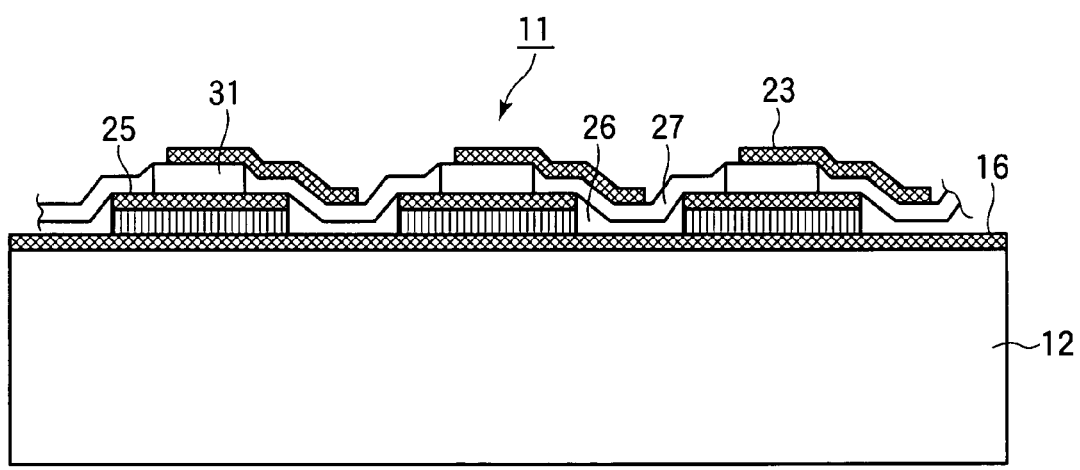
FIG. 6 is a cross-sectional view of the LED array taken along a line B-B of FIG. 5.

FIG. 4 is a cross-sectional view of the LED array 11 taken along a line A-A of FIG. 5. FIG. 5 is a partial expanded view of the LED array. FIG. 6 is a cross-sectional view of the LED array 11 taken along a line B-B of FIG. 5.

A reflective film 25 is a metal thin film of, for example, titanium or silver having a thickness in the range of 200-600 angstroms and is patterned on the planarization film 16 of the substrate 12 by vapor deposition. The LEDs 31 are pn junctions of hetero structure or double hetero structure, bonded onto the reflective film 25.

The LED array 11 is a layered thin film structure formed of an inorganic material, for example, indium-aluminum-gallium-phosphide (InAlGaP) or gallium-arsenide-phosphide (GaAsP). The LED array 11 is epitaxially grown on a substrate (not shown) separate from the reflective film 25, and are then detached from the substrate. The detached LED array 11 is then bonded onto the reflective film 25 by intermolecular force such as hydrogen bond. The array 11 has a plurality of LEDs 31, isolated into individual light emitting elements and arranged in a two-dimensional plane.

A large size LED array 11 including a plurality of rows and columns of LEDs 31 may be detached from a substrate, and then bonded onto the reflective layer 25. Then, the large size LED array 11 may be isolated by photolithographic etching into individual LEDs 31. Alternatively, a small size LED array 11 including only a column or a row of LEDs 31 may be detached from the substrate and then bonded to the reflective layer 25. Then, the small size LED array 11 may be isolated by photolithographic etching into individual LEDs 31. Still alternatively, a large size LED array 11 may be first isolated into individual LEDs 31 and then the individual LEDs 31 may be detached from the substrate. Then, the individual LEDs 31 may be bonded onto the reflective layer 25.

The reflective layer 25 may be in the form of a stacked layer structure formed on a substrate, and then a layered thin film of hetero structure or double hetero structure may be epitaxially grown on the stacked reflective layer 25, in which case the reflective layer 25 need not be patterned by vapor deposition. The layered thin film including the LED array 11 and the reflective layer 25 may be detached in unison from the substrate, and then bonded onto the planarization film 16 on another substrate by intermolecular force. This simplifies the manufacturing steps of the LED array 11.

The anode wire 23 and cathode wire 24 may be a single layer of, for example, gold, aluminum, or titanium, or a layered thin film of, for example, gold-nickel-titanium or aluminum-nickel-titanium. The anode wires 23 and cathode wires 24 are connected to the anodes and cathodes of the LEDs 31, respectively, defining columns and rows of a matrix.

As shown in FIGS. 4 and 6, insulating films 26 and 27 of, for example, polyimide or silicon nitride are formed under the anode wires 23 and cathode wires 24, so that the anode wires 23 and cathode wires 24 forming columns and rows are not electrically shorted.

The operation of the head-up display apparatus 1 of the aforementioned configuration will be described.

When the controller of the head-up display apparatus 1 receives the display information, the controller generates drive data that describes "ON" or "OFF" of each of the LEDs 31 in rows of the LED array 11 and frame signals that select corresponding rows of the LED array 11. Then the controller controls the anode circuit 17 and cathode circuit 18 in accordance with the display information.

Drive data that describes "ON" or "OFF" of each of the LEDs 31 in the first row of the LED array 11 is stored sequentially into the shift register of the anode circuit 17.

Then, the drive data is stored in the latch of the anode circuit 17. Each amplifier of the anode circuit 17 supplies constant current to a corresponding LED 31 in accordance with the drive data in the latch. The constant current flows via the anode substrate 13 and the corresponding anode wires 23 to the anodes of the respective LEDs 31 of the LED array 11 in accordance with the drive data to cause the LEDs 31 to emit light.

When a frame signal is input into the cathode circuit 18, the cathode wires 24 of the first row of the LED array 11 are selected so that current flows in accordance with the drive data from the anode wires 23 into the LEDs 31 to cause the LEDs 31 in the first row to emit light.

The aforementioned operation is repeated as many times as there are cathode wires 24, i.e., as many times as there are rows of the LED array 11, thereby completing an image for one frame to be displayed on the light source apparatus 10.

The light emitted from the LEDs 31 of the light source apparatus 10 is reflected by the dichroic mirror 2 and then hologram mirror 4 to illuminate the reflective layer 6 disposed on the windshield 5, thus forming a virtual image 8 of the image generated by the light source apparatus 10 at a position forward of the windshield 5 in the line of light of the driver.

In order to provide an image having sufficient intensity for the driver to recognize, the anode circuit 17 is required to supply large current to the LEDs 31 of the LED array 11. Large current flowing through the LEDs 31 generates considerable heat. This heat is dissipated through the substrate 12 to the instrument panel 7 or the chassis of the head-up display apparatus 1.

Thus, heat generated by large current supplied to the LEDs 31 is efficiently dissipated through the substrate 12 formed of a metal material having high heat conductivity to the chassis of the head-up display apparatus 1, thereby preventing the LEDs 31 from deteriorating in intensity.

Since the substrate 12 is formed of a rigid metal material, when the light source apparatus 10 is attached to, for example, the chassis of the head-up apparatus 1, the light source apparatus 10 has a low chance of being damaged.

Thus, the light source apparatus 10 of the first embodiment and the head-up display 1 that employs the light source apparatus 10 have a long usable life with high intensity, is easy to assemble and free from damage during assembly, and lends itself to miniaturization.

Second Embodiment

Elements similar to those of the first embodiment have been given the same reference numerals and their description is omitted. Similar configurations 10 to those of the first embodiment operate much the same way and provide similar advantages.

Figure 7:
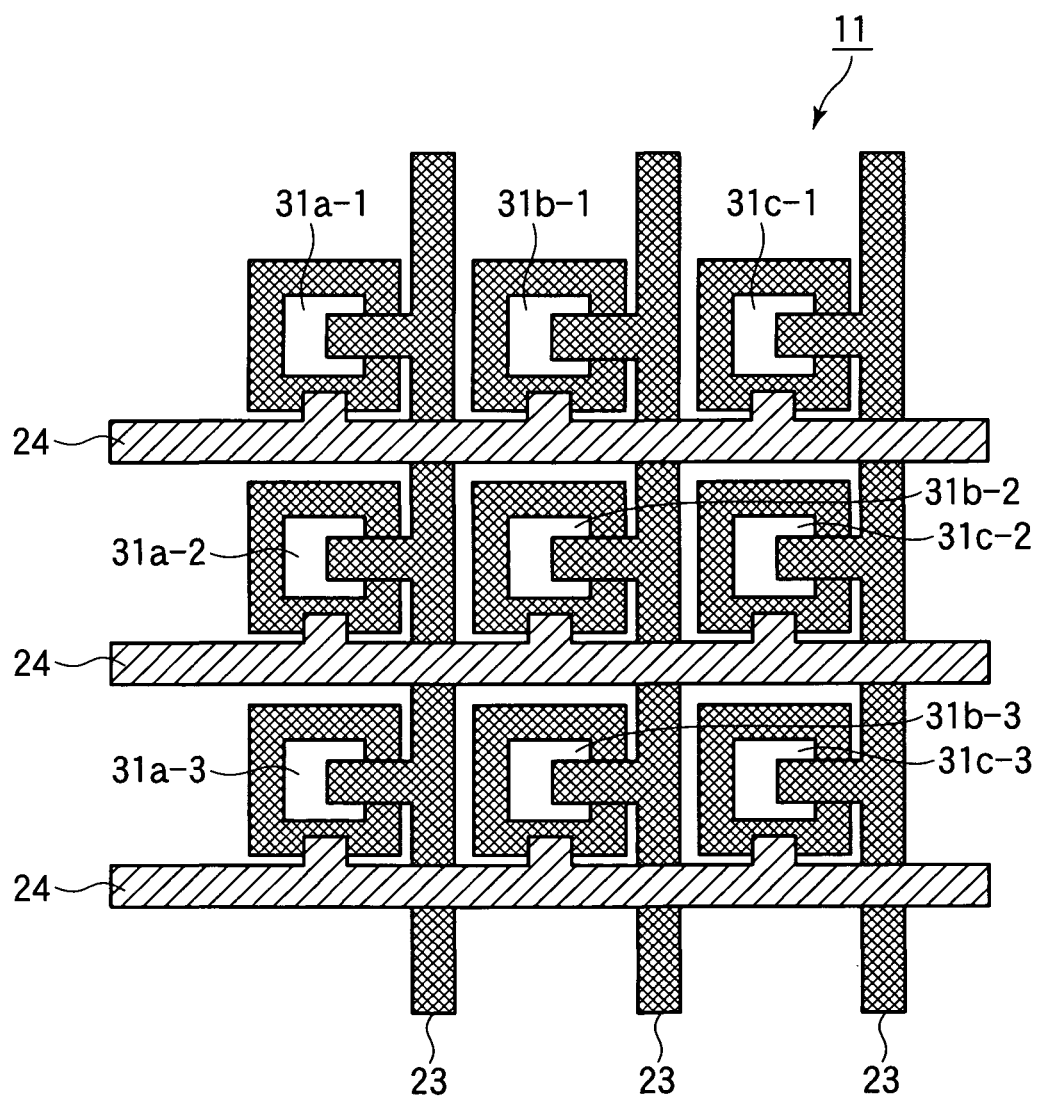
FIG. 7 is an enlarged view of a part of an LED array of a light source of a second embodiment.

FIG. 7 is an enlarged view of a part of an LED array 11 of a light source apparatus of a second embodiment.

LEDs $31a$-1, $31a$-2, and $31a$-3 emit red light. LEDs $31b$-1, $31b$-2, and $31b$-3 emit green light. LEDs $31c$-1, $31c$-2, and $31c$-3 emit blue light. In other words, LEDs $31a$-1, $31a$-2, and $31a$-3, LEDs $31b$-1, $31b$-2, and $31b$-3, and LEDs $31c$-1, $31c$-2, and $31c$-3 emit light of different wavelengths from one another. The LED array 11 include rows of red light LEDs, rows of green light LEDs, and rows of blue light LEDs arranged such that the row of red light LEDs, the row of green light LEDs, and the row of blue light LEDs are aligned alternately with one another to form stripes of colors red, green, and blue.

The LED $31a$ that emits red light is a layered thin film structure formed of an epitaxially grown inorganic material, for example, indium-aluminum-gallium-phosphide (InAlGaP) or gallium-arsenide-phosphide (GaAsP). The LED $31a$ is a pn junction device of, for example, hetero structure or double hetero structure, and may be fabricated from any material as long as light having a wavelength in the range of 620 to 710 nm can be obtained.

The LED $31b$ that emits green light is a layered thin film structure formed of an epitaxially grown inorganic material, for example, indium-aluminum-gallium-phosphide (InAlGaP) or gallium-phosphide (GaP). The LED $31b$ is a pn junction device of, for example, hetero structure or double hetero structure, and may be fabricated from any material as long as light having a wavelength in the range of 500 to 580 nm can be obtained.

The LED $31c$ that emits blue light is a layered thin film structure formed of an epitaxially grown inorganic materials, for example, gallium nitride or indium nitride-gallium. The LED $31c$ is a pn junction device of, for example, hetero structure or double hetero structure, and may be fabricated from any material as long as light having a wavelength in the range of 450 to 500 nm can be obtained.

The anode circuit 17 supplies current to the row of the LEDs $31a$-1 to $31a$-3 (red), the row of the LEDs $31b1$ to $31b$-3 (green), and the row of the LEDs $31c$-1 to $31c$-3, respectively, in accordance with the drive data. The anode circuit 17 includes a shift register, a latch, a constant current circuit and an amplifier for driving the LEDs in a corresponding the row. These circuits are integrated in the anode circuit 17.

The remaining portions of the configuration are the same as those of the first embodiment and their description is omitted.

The operation of the head-up display apparatus 1 of the second embodiment will be described.

When the controller of the head-up display apparatus 1 receives the display information for red, green, and blue light, the controller controls the anode circuit 17 and cathode circuit 18 in accordance with the display information.

The drive data that describes "ON" or "OFF" of each of the LEDs 31a, 31b, and 31c in the first row of the LED array 11 is stored sequentially into the shift registers of the anode circuit 17 for the LEDs 31a, 31b, and 31c, respectively.

Then, the drive data for the LEDs 31a, 31b, and 31c is stored into corresponding latches of the anode circuit 17. Each of the amplifiers of the anode circuit 17 supplies constant current to a corresponding LED, i.e., 31a, 31b, or 31c in accordance with the drive data held in the latches. The constant current flows via the anode substrate 13 and the corresponding anode wires 23 to the anodes of the LED 31a, 31b, and 31c of the LED array 11.

When a frame signal is input into the cathode circuit 18, the cathode wire 24 of the first row of the LED array 11 is selected and current flows from the anode wires 23 into the LEDs 31a, 31b, and 31c in accordance with the drive data so that the LEDs 31a, 31b, and 31c, if driven by the drive data, emit light.

The aforementioned operation is repeated as many times as there are cathode wires, i.e., as many times as there are rows of the LED array 11, thereby completing an image for one frame to be displayed on the light source apparatus 10.

The red, green, and blue light emitted from the LEDs of the light source apparatus 10 are reflected by the dichroic mirror 2 and then hologram mirror 4, and then illuminates the reflective layer 6 disposed on the windshield 5, so that a virtual image 8 of the image generated by the light source apparatus 10 is formed at a position forward of the windshield 5 in the line of light of the vehicle driver.

As described above, the head-up display apparatus 1 of the second embodiment provides color display information, providing easy-to-see display information to the vehicle driver.

Third Embodiment

Elements similar to those of the first and second embodiments have been given the same reference numerals and their description is omitted. Similar configurations operate much the same way and provide similar advantages.

Figure 8:
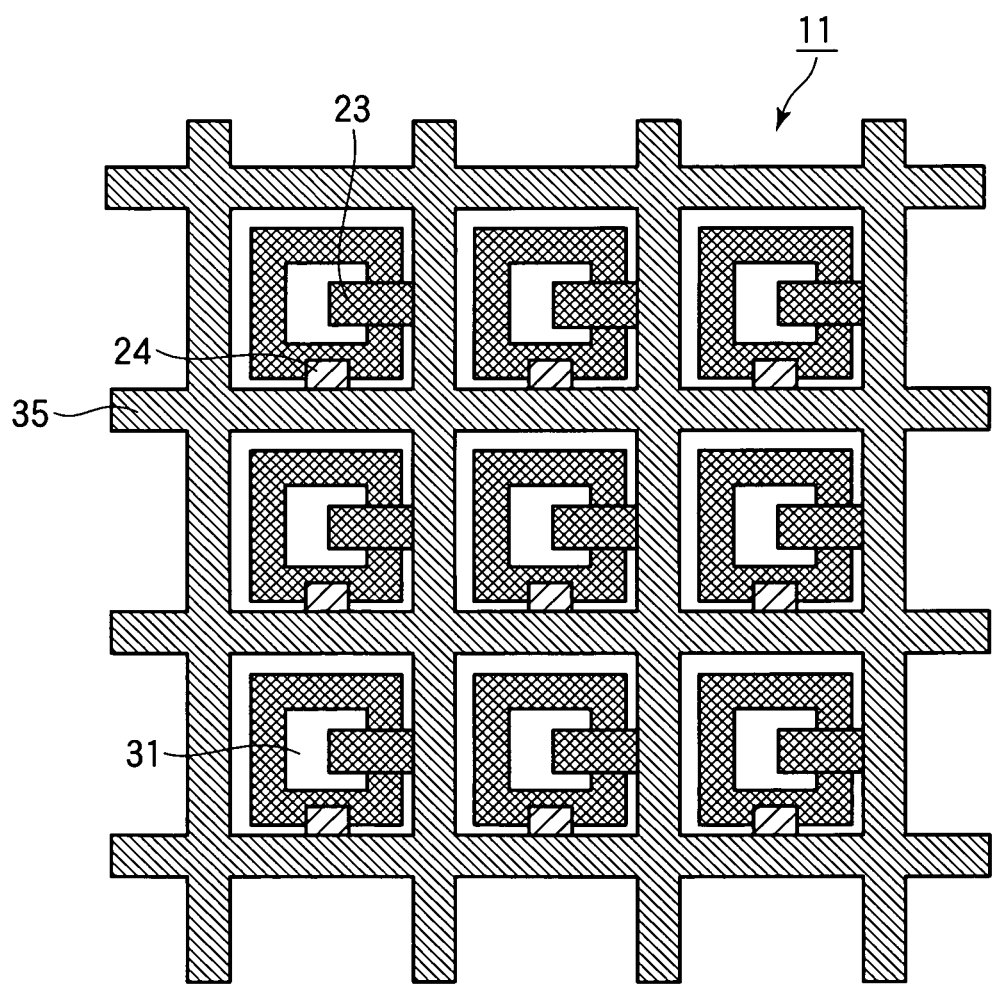
FIG. 8 is an enlarged view of an LED array of a light source apparatus of a third embodiment.

FIG. 8 is an enlarged view of an LED array of a light source apparatus 10 of a third embodiment.

Referring to FIG. 8, a light shielding layer 35 is a photoresist coating colored with a black pigment, and is patterned by photolithographic etching over the anode wires 23 and cathode wires 24 to form a grid-like pattern after the anode wires 23 and the cathode wires 24 have been formed.

The light shielding layer 35 may also be formed of, for example, a chromium compound such as chromium oxide, or a nickel compound such as nickel oxide, nickel nitride, which is a material other than the photoresist coating colored with a black pigment, in which case, the anode wires 23 and cathode wires 24 are first formed, then an insulating film is formed on the anode wires 23 and cathode wires 24, and finally a metal thin film is preferably formed to form a grid-like pattern.

The remaining portions of the configuration are the same as those of the first embodiment, and their description is omitted.

The operation of the head-up display apparatus 1 of the third embodiment will be described.

When the controller of the head-up display apparatus 1 receives display information, the controller controls the anode circuit 17 and cathode circuit 18 in accordance with the display information.

Drive data that describes "ON" or "OFF" of each of the LEDs 31 in the first row of the LED array 11 is stored sequentially into the shift registers of the anode circuit 17.

Then, the drive data is stored into the latches of the anode circuit 17. The amplifiers of the anode circuit 17 supplies constant current to the LEDs in accordance with the drive data in the latch. The constant current flows via the anode substrate 13 and corresponding anode wires 23 into the anode of each LED 31 of the LED array 11.

When a frame signal is input into the cathode circuit 18, the cathode wire 24 of the first row of the LED array 11 is selected and current flows from the anode wires 23 into the LEDs 31a, 31b, and 31c in accordance with the drive data so that the LEDs 31a, 31b, and 31c, if driven by the drive data, emit light of corresponding colors.

The aforementioned operation is repeated as many times as there are cathode wires 24, i.e., as many times as there are rows of the LED array 11, thereby completing an image for one frame to be displayed on the light source apparatus 10.

The light emitted from the LEDs 31 of the light source apparatus 10 is reflected by the dichroic mirror 2 and then hologram mirror 4, and then illuminates the reflective layer 6 disposed on the windshield 5, so that a virtual image 8 of the image generated by the light source apparatus 10 is formed at a position forward of the windshield 5 in the line of light of the vehicle driver.

The light shielding layer 35 formed on the anode wires 23 and cathode wires 24 prevents the light emitted from the LEDs 31 from entering unwanted areas, thereby enhancing the contrast of the image exiting from the light source apparatus 10. This in turn enhances the contrast of the virtual image 8 displayed forward of the windshield 5 in the driver's line of sight.

Ambient light such as sunlight entering the vehicle through the windshield 5 may be reflected by the dichroic mirror 2 and hologram mirror 4 to illuminate the light source apparatus 10. Since the light shielding layer 35 is black, the light shielding layer 35 does not reflect the ambient light, minimizing adverse effects of the ambient light reflected by the light source apparatus 10 on the virtual image 8 formed forward of the windshield 5.

Since most of ambient light entering the optical system of the invention is not reflected back by the light source apparatus 10, a significant amount of the ambient light will not reach the reflective layer 6.

The invention being thus described, it will be obvious that the same may be varied in many ways. Such variations are not to be regarded as a departure from the scope of the invention, and all such modifications as would be obvious to one skilled in the art intended to be included within the scope of the following claims.

What is claimed is:

1. A light source apparatus comprising:
a metal substrate;
an electrically insulating planarization film formed on the metal substrate;
a plurality of reflective metal layers formed on the planarization film;
a plurality of LED (light emitting diode) thin films arranged in a matrix having columns extending in a first direction and rows extending in a second direction perpendicular to the first direction, each of the plurality of LED thin films being bonded to a corresponding one of the plurality of reflective metal layers via intermolecular force;

a plurality of first wires, each of the plurality of first wires being electrically connected to a corresponding one of first electrodes of the LED thin films;

a plurality of second wires, each of the plurality of second wires being electrically connected to a corresponding one of second electrodes of the LED thin films via a corresponding one of the plurality of reflective metal layers;

a first driver circuit for selectively electrically driving the LED thin films arranged in the rows via the plurality of first wires; and a second driver circuit for selectively electrically driving the LED thin films arranged in the columns via the plurality of second wires.

2. The light source apparatus according to claim 1, wherein the plurality of LED thin films include three types of LED thin films, the three types of LED thin films being capable of emitting light of different wavelengths, wherein the LED thin films that emit light having a same wavelength are aligned either in the rows or in the columns.

3. The light source apparatus according to claim 1, wherein the LED thin films are p-n junction devices formed of layered thin films based on epitaxially grown inorganic materials.

4. The light source apparatus according to claim 1, wherein the metal substrate includes a portion in which a mounting hole is formed.

5. The light source apparatus according to claim 1, further comprising a light shielding layer configured to partially cover the plurality of first wires and the plurality of second wires, the light shielding layer surrounding each LED thin film.

6. The light source apparatus according to claim 5, wherein the light shielding layer is formed of a photoresist coating colored with a black pigment.

7. A head-up display apparatus comprising:
a light source apparatus comprising:
a metal substrate;
an electrically insulating planarization film formed on the metal substrate;
a plurality of reflective metal layers formed on the planarization film;
a plurality of LED (light emitting diode) thin films arranged in a matrix having columns extending in a first direction and rows extending in a second direction perpendicular to the first direction, each of the plurality of LED thin films being bonded to a corresponding one of the plurality of reflective metal layers via intermolecular force;
a plurality of first wires, each of the plurality of first wires being electrically connected to a corresponding one of first electrodes of the LED thin films;
a plurality of second wires, each of the plurality of second wires being electrically connected to a corresponding one of second electrodes of the LED thin films via a corresponding one of the plurality of reflective metal layers;
a first driver circuit for selectively electrically driving the LED thin films arranged in the rows via the plurality of first wires; and
a second driver circuit for selectively electrically driving the LED thin films arranged in the columns via the plurality of second wires;
a dichroic mirror that reflects the light emitted from the light source apparatus;
a hologram mirror that reflects the light reflected from the dichroic mirror; and
a reflective member that reflects the light reflected from the hologram mirror toward a viewer, the reflective member including a holographic optical element having a reflection angle that varies based on the wavelength of light.

* * * * *